(12) United States Patent
Kunkel et al.

(10) Patent No.: US 6,578,369 B2
(45) Date of Patent: Jun. 17, 2003

(54) NOZZLE DESIGN FOR GENERATING FLUID STREAMS USEFUL IN THE MANUFACTURE OF MICROELECTRONIC DEVICES

(75) Inventors: Pam Kunkel, Cologne, MN (US); Natraj Narayanswani, San Jose, CA (US); John C. Patrin, Chanhassen, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/820,281

(22) Filed: Mar. 28, 2001

(65) Prior Publication Data

US 2002/0139125 A1 Oct. 3, 2002

(51) Int. Cl.$^7$ ............................. F25D 17/02; B05C 5/00; B05B 15/00; B05B 17/00; A62C 31/02
(52) U.S. Cl. ............................ 62/64; 118/308; 118/310; 118/315; 239/289; 239/601
(58) Field of Search .................. 118/315, 308, 118/310; 239/289, 601; 62/64

(56) References Cited

U.S. PATENT DOCUMENTS

| | | | | |
|---|---|---|---|---|
| 3,968,935 A | * | 7/1976 | Sohre ........................ | 239/289 |
| 4,747,421 A | | 5/1988 | Hayashi ..................... | 134/201 |
| 4,806,171 A | | 2/1989 | Whitlock et al. ............. | 134/7 |
| 4,974,375 A | | 12/1990 | Tada et al. .................... | 51/413 |
| 5,009,240 A | | 4/1991 | Levi .............................. | 134/7 |
| 5,062,898 A | | 11/1991 | McDermott et al. .......... | 134/7 |
| 5,096,746 A | * | 3/1992 | Strizki ........................ | 118/315 |
| 5,209,028 A | | 5/1993 | McDermott et al. .......... | 51/426 |
| 5,294,261 A | | 3/1994 | McDermott et al. ........... | 134/7 |
| 5,377,911 A | | 1/1995 | Bauer et al. ................. | 239/135 |
| 5,462,596 A | * | 10/1995 | Arnaud et al. ............... | 118/310 |
| 5,810,942 A | | 9/1998 | Narayanswami et al. ...... | 134/7 |
| 5,942,037 A | | 8/1999 | Wagener et al. ............. | 118/315 |
| 5,993,554 A | * | 11/1999 | Keicher et al. ............. | 118/308 |

OTHER PUBLICATIONS

N. Narayanswami, "A Theoretical Analysis of Wafer Cleaning Using a Cryogenic Aerosol," J. of the Electrochemical Society, 146–2:767–774 (1999).

N. Narayanswami et al., "Development and Optimization of a Cryogenic Aerosol Based Wafer Cleaning System," 28$^{th}$ Annual Meeting of the Fine Particle Society Proceedings (1998).

N. Narayanswami et al., "Particle Removal Mechanisms in Cryogenic–Aerosol–Based Wafer Cleaning," FSI International Document No. 1133–TRS–0499 (1999).

Product Literature by FSI International, Inc. entitled FSI® Aries™ CryoKinetic Cleaning Systems.

* cited by examiner

Primary Examiner—William C. Doerrler
Assistant Examiner—Filip Zec
(74) Attorney, Agent, or Firm—Kagan Binder, PLLC

(57) ABSTRACT

Improved nozzle design that discharges more powerful, more focused fluid streams through a series of nozzle orifices distributed along a length of the nozzle. The present invention may be incorporated into a wide range of microelectronic device manufacturing processes and equipment types for which an array of more forceful, more focused process streams are desired for treating microelectronic workpieces. The present invention is particularly useful to cryogenically clean microelectronic workpieces, where the improvements allow the conventionally more troublesome smaller contaminant particles to be cleaningly removed with greater particle removal efficiency.

17 Claims, 9 Drawing Sheets

US 6,578,369 B2

NOZZLE DESIGN FOR GENERATING FLUID STREAMS USEFUL IN THE MANUFACTURE OF MICROELECTRONIC DEVICES

FIELD OF THE INVENTION

The present invention relates to equipment and methods for efficiently generating fluid streams that may be used in the manufacture of microelectronic devices. More specifically, the present invention relates to equipment and methods in which process fluids are dispensed through a nozzle including a plurality of divergent orifices. The invention is particularly useful for efficiently generating a cryogenic aerosol.

BACKGROUND OF THE INVENTION

The manufacture of microelectronic devices is complex and involves several process steps. Many of these steps involve applying one or more streams of fluid and/or particles (e.g., cryogenic cleaning crystals) onto a workpiece surface in order to carry out one or more of etching, cleaning, stripping, rinsing, and the like. Often, it may be important to ensure that the fluid is directed onto the workpiece surface as efficiently as possible to help optimize process performance. Cryogenic-aerosol cleaning of microelectronic workpieces is one illustrative area of concern.

Cryogenic-aerosol cleaning of wafers is a "dry" cleaning alternative to more conventional wet chemical cleans for particle and film residue removal. This technique is of particular interest in back-end-of-line applications in which wet chemicals might potentially corrode device features such as metal lines. Cryogenic-aerosol cleaning is able to use non-corrosive, inert substances such as argon, nitrogen, carbon dioxide, and/or the like, as the cleaning fluid. The cleaning mechanisms are mechanical rather than chemical. The process is therefore environmentally friendly and device-safe.

A schematic drawing of an illustrative cryogenic cleaning process is shown in FIG. 1. A cryogenic apparatus 1 includes a chuck (not shown) that supports a microelectronic workpiece 1a. A nozzle 2 extends across workpiece 1a. An array of cryogenic aerosol jets 3 issue from a plurality of nozzle orifices (not shown) of nozzle 2. The jets 3 include aerosol crystals 3a. These jets 3 of particles 3a impinge upon the surface of workpiece 1a, dislodging contaminants 4 adhering to the workpiece surface. The surface may be flat or patterned. Typical contaminants 4 might include one or more of film or particle residue generated as a result of etching and ashing processes. Nozzle 2 and the chuck move relative to each other to ensure that the jets clean the entirety of surface of workpiece 1a. In the particular approach of FIG. 1, nozzle 2 is stationary, while the chuck, and hence workpiece 1a, move so that the entire surface of workpiece 1a is cleaned by movement underneath nozzle 2. Of course, in other embodiments, the chuck could be stationary while nozzle 2 moves. In other embodiments, suitable relative movement may be obtained if both the chuck and nozzle 2 move relative to each other. For example, U.S. Pat. No. 5,942,037 describes a system that has a movable chuck and a rotatable and translatable nozzle.

The formation of cryogenic aerosol jets is an interesting process. The jets are formed by the rapid expansion of a suitable cryogenic fluid through the array of nozzle orifices. The fluid is generally a liquid, gas, or mixture thereof of one or more materials such as nitrogen, argon, carbon dioxide, water, or mixtures of these. The fluid enters the nozzle orifices at one pressure (e.g, 80 psia) and exits into a chamber maintained at a considerably lower pressure (typically below 1 psia). The resultant expansion of the fluid results in the formation of solid, or solid-liquid, particle clusters in each jet due to evaporative cooling. Further discussion of aerosol formation mechanisms can be found in U.S. Pat. No. 5,942,037; N. Narayanswami, "A Theoretical Analysis of Wafer Cleaning Using a Cryogenic Aerosol," J. of the Electrochemical Society, 146-2:767–774 (1999); N. Narayanswami et al., "Development and Optimization of a Cryogenic Aerosol Based Wafer Cleaning System," 28$^{th}$ Annual Meeting of the Fine Particle Society Proceedings (1998); and N. Narayanswami et al, "Particle Removal Mechanisms in Cryogenic-Aerosol-Based Wafer Cleaning," FSI International Document No. 1133-TRS-0499 (1999).

U.S. Pat. Nos. 4,747,421 and 4,806,171 describe an apparatus for cleaning substrates using $CO_2$ aerosol particles. U.S. Pat. Nos. 4,974,375 and 5,009,240 describe sandblasting devices that use ice particles generated using water. U.S. Pat. Nos. 5,062,898, and 5,209,028, and 5,294,261 describe the use of cryogenic aerosols for surface cleaning. Borden et. al., in a paper presented at the Ultraclean Manufacturing Conference, pp. 55–60, October 1994, describes the use of $CO_2$ snow jet spray in silicon wafer cleaning.

Contaminant particle removal efficiency is an important criterion for assessing the performance of a cryogenic cleaning process. Contaminant particle removal efficiency refers to the percentage of particles that are removed as a result of cryogenic aerosol cleaning. Particle removal efficiency characteristics are often viewed separately for particles within different size ranges, because it is important that particle removal efficiency be as high as possible for both large and small particles. Given the increasing miniaturization of microelectronic structures, even the presence of very small particles can significantly impair or ruin the performance of the resultant microelectronic device. Unfortunately, although cryogenic cleaning removes relatively large particles easily, smaller particles are much harder to remove. As a consequence, particle removal efficiency has been observed to decrease with decreasing particle size.

For example, in one illustrative test, about 36,000 particles were dunk deposited onto the surface of a test wafer. Cryogenic cleaning was used to clean the wafer surface, and then the particle removal efficiency was evaluated. Not surprisingly, larger particles were easily removed. Analysis showed that about 100% of particles greater in size than 0.5 micrometer were removed. Performance for smaller particles, however, was not as good. Analysis showed that only about 88% of particles greater in size than 0.1 micrometer were removed.

What is needed, therefore, is a way to improve the ability of a cryogenic aerosol to remove smaller particles.

SUMMARY OF THE INVENTION

The present invention provides an improved nozzle design that discharges more powerful, more focused streams of fluid and/or particles through a series of nozzle orifices distributed along a length of the nozzle. The present invention may be incorporated into a wide range of microelectronic device manufacturing processes and equipment types for which an array of more forceful, more focused process streams are desired for treating microelectronic workpieces.

The present invention is particularly useful to cryogenically clean microelectronic workpieces, where the improvements allow the conventionally more troublesome smaller contaminant particles to be cleaningly removed with greater particle removal efficiency. For example, whereas one conventional nozzle structure might allow 0.105 to 0.120 micrometer SiN particles to be removed with a particle removal efficiency of only 87.9%, use of the present invention boosts particle removal efficiency to at least 93.5%. As another example, one conventional nozzle structure might allow 0.064 micrometer W particles to be removed with a particle removal efficiency of only 87%, whereas the present invention boosted this value to 95.8%.

In one aspect, the present invention relates to an apparatus for cryogenically treating a surface of a workpiece. The apparatus includes a treatment chamber in which the workpiece is positioned for a cryogenic treatment, wherein the treatment chamber is at a first, relatively low pressure. The apparatus includes a nozzle that comprises a plurality of nozzle orifices that are distributed along a length of the nozzle in a manner effective to aim at an angle of impingement toward the workpiece surface. Each nozzle orifice comprises a nozzle inlet through which a process fluid enters the nozzle and an outlet through which the process fluid is cryogenically discharged from the nozzle toward the workpiece surface. The nozzle is at a second, relatively high pressure such that the difference between the first and second pressures helps to cause the process fluid to be cryogenically discharged from the the nozzle, and wherein each of at least two of the nozzle orifices comprises a divergent section. The divergent section allows the cyrogenic aerosol to expand in a relatively controlled fashion and preferably is proximal to the orifice outlet. In other embodiments, the divergent section may be proximal to the inlet, or it may extend continuously from the inlet to the outlet, or it may be positioned inside the nozzle orifice between and spaced apart from the inlet and outlet.

In another aspect, the present invention relates to a method of cryogenically treating a surface of a workpiece. A process fluid is caused to be cryogenically discharged from a plurality of orifices of a nozzle onto the workpiece surface. The orifices each have an inlet through which the fluid enters the orifice and an outlet through which the fluid is discharged from the orifice. At least two of the orifices comprises a divergent section, preferably being proximal to the orifice outlet.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The principles of the present invention are advantageously incorporated into cryogenic cleaning processes and, in fact, offer improvements in particle removal efficiency in this context. The enhanced nozzle orifice design of the present invention is an important aspect of this improvement. In a conventional cryogenic cleaning apparatus, cleaning fluid is cryogenically discharged onto a workpiece surface through an array of linear, constant diameter orifices. In such an orifice design, relatively uncontrolled expansion of the process fluid occurs, generating shock waves that lead to energy loss. The resultant jets of cryogenically discharged fluid tends to be relatively unfocused and the aerosol is weakened. Particle removal efficiency for this kind of approach decreases significantly with decreasing particle size.

Figure 1:
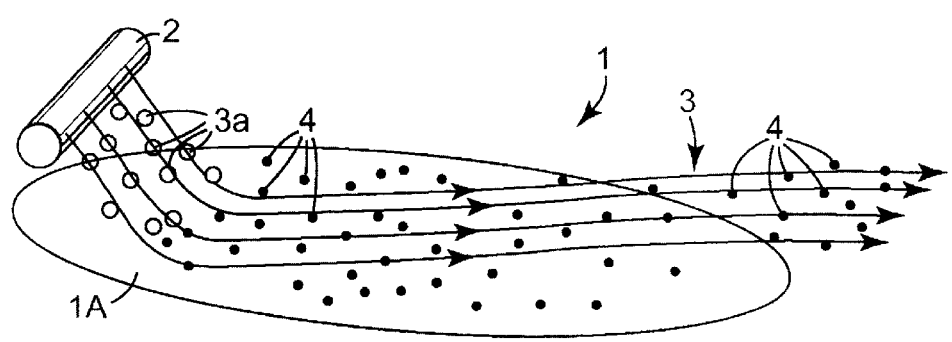
FIG. 1 is a schematic view of a typical cryogenic aerosol system for cleaning the surface of a silicon wafer.
Figure 2:
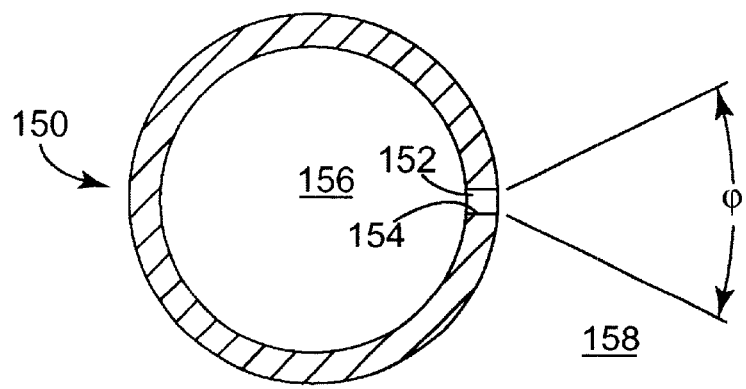
FIG. 2 is a schematic cross-section view of a nozzle having a linear, non-divergent nozzle orifice that produces a relatively unfocused jet of fluid.

The drawbacks of linear, constant diameter nozzle orifices are illustrated schematically in FIG. 2. There, nozzle 150 includes linear, constant diameter, nozzle orifice 152 defined by cylindrical wall 154. As process fluid flows from high pressure region 156 to low pressure region 158, relatively uncontrolled expansion of the fluid occurs, generating shock waves. Process fluid is discharged with a relatively wide, unfocused dispersion angle $\phi$.

In contrast, practice of the present invention greatly enhances particle removal efficiency by using nozzle orifices with a divergent fluid pathway proximal to the nozzle outlet. This is illustrated schematically in FIG. 3. There, the nozzle 160 includes a plurality of divergent nozzle orifices 162 (only one of which is shown) defined by conical wall 164. Relatively small diameter inlet 166 is proximal to high pressure region 168, and relatively large diameter outlet 170 is proximal to low pressure region 172. Preferably, the ratio of the inner diameter to the outer diameter may be in the range from about 1:10 to about 1:1.5. The longitudinal distance between the inlet and the outlet preferably 1 to 20, more preferably 4 to 10 times the diameter of the inlet. In a particularly preferred embodiment, the inner diameter is 0.005 inches, the outer diameter is 0.019 inches, and the distance from the inlet to the outlet is 0.035 inches.

As shown, the cross-section of orifice 162 diverges at a linear rate from inlet 166 to outlet 170. The angle of divergence θ from the inlet to the outlet may have a wide range of values, depending upon factors such as the desired velocity of the fluid that exits the orifices. As general guidelines, the angle of divergence θ may be in the range from 5° to 70°, more preferably 11° to about 35°, most preferably about 11 to 18°.

Figure 4:
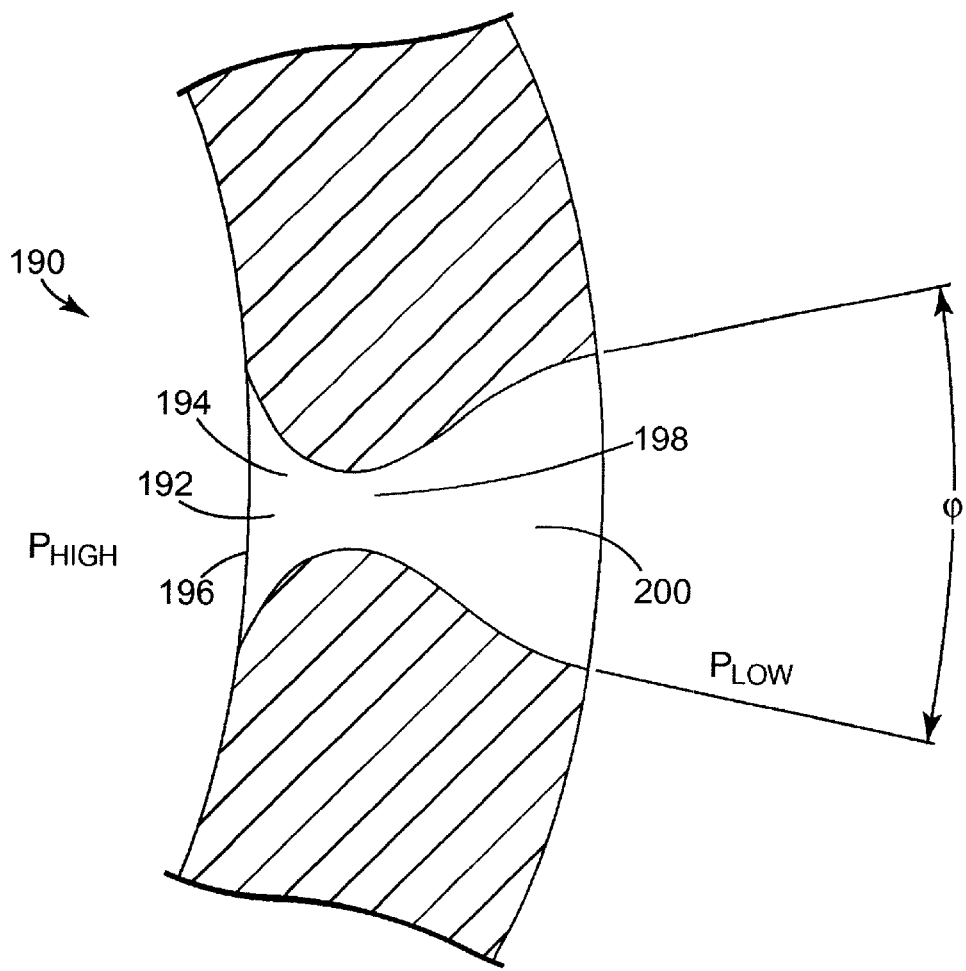
FIG. 4 is a schematic cross-section view of an alternative nozzle of the present invention incorporating a divergent nozzle orifice.

Additionally, orifice 162 as shown diverges along the entirety of its length from inlet 166 to outlet 170. However, other embodiments may have a geometry in which the diverging section begins intermediate between inlet 166 and outlet 170. For example, a nozzle structure with a convergent-divergent structure is schematically shown in FIG. 4. There, nozzle 190 includes orifice 192 having a fluid pathway with three main sections. A first section 194 near the inlet 196 is a relatively short converging section. This narrows to the second section 198, which is referred to as a throat. After the throat, the third section 200 is a divergent section that has a special contour that may be calculated using conventional techniques to provide a desired exit velocity.

Figure 3:
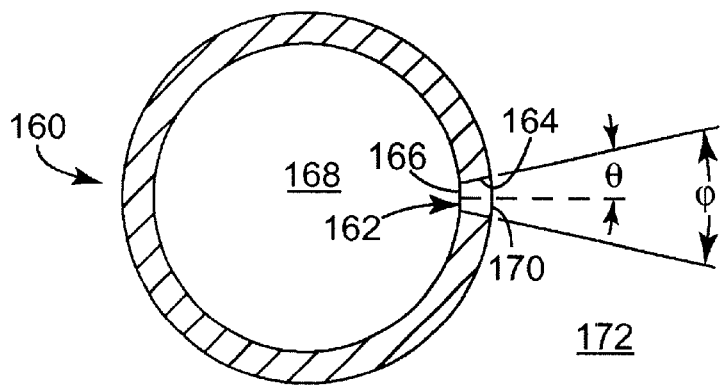
FIG. 3 is a schematic cross-section view of a nozzle of the present invention incorporating a divergent nozzle orifice.

The simple, linear, diverging nozzle orifice as shown in FIG. 3 is much easier to incorporate into the nozzle from a manufacturing perspective than is the orifice of FIG. 4, and thus is presently preferred. The conical orifice 162 as shown in FIG. 3 is very easy to form, for example, using EDM techniques.

The divergent nozzle orifices of the present invention provide a gradual transition for the process fluid to expand inside the nozzle orifice. This pressure transition zone reduces the energy losses that might otherwise occur as a result of expansion and produces a more powerful, more focused cryogenic cleaning aerosol. This is in contrast to the linear nozzle orifices wherein expansion occurs primarily outside of the nozzle in the low pressure region where expansion is sudden and uncontrolled. Process fluid is discharged with a relatively narrow, more focused dispersion angle φ as compared to nozzle 150 of FIG. 2. When an array of such nozzle orifices is used to cryogenically dispense a cleaning medium onto a workpiece surface, particle removal efficiency is improved, and the improvement is particularly significant for smaller particles (i.e., particles that are 0.1 micrometer and smaller).

The fact that the divergent nozzle orifices of the present invention dispense a more focused fluid is counterintuitive. One might ordinarily expect the wider angle of divergence θ of such a nozzle orifices to dispense fluid at a wider dispersion angle φ than a non-divergent orifice. Such is not the case, however, due at least in part to the more controlled fluid expansion that occurs in the divergent structure.

In addition to cryogenic cleaning application, the principles of the present invention can be incorporated into a wide range of other kinds of equipment in which multiple jets of process fluid(s) are directed onto a workpiece surface, particularly in processes followed in the microelectronic device industry. As one example, a common method of rinsing chemically treated semiconductor wafers involves spraying the wafers with atomized liquid jets. Spray processing tools of this type are commercially available under the trade designations MERCURY and ZETA from FSI International, Inc. The atomization is achieved by impacting liquid streams with each other and/or with energetic gas streams. The present invention can be used to efficiently generate high speed gas jets to impact the liquid streams. This would help to improve atomization characteristics.

Another application of the invention relates to generating high speed gas jets that are used to dry wet surfaces, e.g., the surfaces of a microelectronic workpiece after it has been rinsed. When a high speed gas jet impinges upon a surface, shock waves may form in the region adjacent to the surface. This tends to cause an increase in pressure and temperature at the surface. The increased pressure and temperature increase the evaporation rate of liquid on the surface, thus reducing overall wafer processing time.

Figure 5:
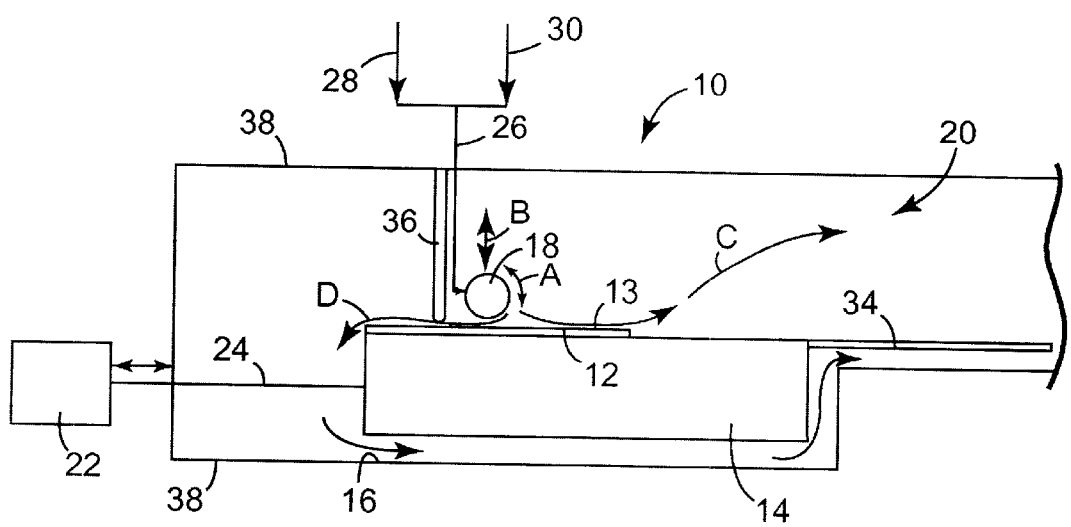
FIG. 5 is a side schematic view of a cryogenic cleaning system of the present invention.

In order to more concretely illustrate the invention, the invention will now be described in the context of an enhancement to one representative cryogenic cleaning tool commercially available under the trade designation ARIES from FSI International, Inc., Chaska, Minn. Referring now to FIG. 5, wherein like numerals represent like components throughout the several Figures, an apparatus 10 is illustrated for the treatment of the surface of an object, such as a microelectronic workpiece 12. The present invention is useful for treating any type of microelectronics workpiece, including but not limited to flat panel displays, hard drives, and multiple chip modules. Additionally, the invention is useful for treating masks used for microlithography processes including x-ray masks, and any semiconductor substrates including but not limited to gallium arsenide wafers or wafers comprised of silicon.

Apparatus 10 basically comprises a movable chuck 14 which supports the microelectronic workpiece 12 within an aerosol chamber 16 and a jet impingement nozzle 18. The nozzle 18 optionally is rotatably adjustable and translatable in accordance with U.S. Pat. No. 5,942,037. The apparatus 10 is used for treating a surface 13 of the substrate, e.g. microelectronic workpiece 12. Such treatment can be any coating, cleaning, or the like treatment wherein the jet impingement nozzle 18 provides an aerosol, liquid or gas to impinge surface 13. For the purposes of a specific description, the apparatus 10 will be described as an aerosol cleaning apparatus used for cleaning contaminants from the surface of a silicon wafer.

The illustrated chuck 14 is of the type exhibiting a linear movement within a predetermined range to move the entire side of the workpiece 12 through the jet impingement stream. The present invention is also applicable to systems utilizing rotational chucks (not shown) whereby rotary movement of the workpiece 12 is produced in order to impinge its surface with the jets from the nozzle 18. Alternatively, in accordance with one embodiment of the present invention, the nozzle may be translatable in the direction parallel to the surface of the wafer in addition to movement of the chuck, or instead of the chuck while the chuck and the wafer remain stationary to accomplish a similar result. The term chuck is used to mean a device which functionally supports the object to be treated. In the case where the chuck moves linearly or rotationally, the chuck also includes the appropriate slide or guide mechanism or turntable. However, where the chuck is stationary, it may be merely a functional support mechanism.

The present invention is particularly applicable for use as a cryogenic aerosol cleaning chamber used for cleaning contaminants from silicon wafers. Cryogenic cleaning may use argon aerosols, nitrogen, carbon dioxide, and/or water, for example. At present, mixtures of argon and nitrogen are preferred. Specific examples of argon cryogenic aerosols combined with nitrogen are disclosed in U.S. Pat. Nos. 5,062,898, 5,209,028 and 5,294,261, all to McDermott et al, and U.S. Pat. No. 5,377,911 to Bauer et al, the entire disclosures of each of which are hereby incorporated by reference.

As shown in FIG. 5, the aerosol chamber 16 defines an enclosed interior space having an exhaust duct 20. Within the aerosol chamber 16, the movable chuck 14 is provided. The movable chuck 14 includes a surface for supporting a microelectronic workpiece 12 thereon and is movably supported so that the surface 13 of the microelectronic workpiece 12 to be treated can be completely moved through the impingement area of the jet impingement nozzle 18. Movable chuck 14 may include any conventional mechanism for securing the microelectronic workpiece 12 to its surface facing jet impingement nozzle 18, such as by vacuum openings that open to the supporting surface for holding the microelectronic workpiece 12 against it. Mechanical fasteners or clips, suction devices, electrostatic devices and electromagnetic devices also are known for fastening the wafer to the chuck. These and others may be utilized. The movable chuck 14 is further supported within the aerosol chamber 16 to provide its necessary movement. Conventional slides and guiding mechanisms can be utilized to define the path of movement of the movable chuck 14. Moreover, an actuating mechanism 22 may be utilized to impart the movement to the movable chuck 14 along its guidepath. Actuator mechanism 22 may comprise any conventional electric, mechanical, electromechanical, hydraulic, pneumatic, or the like actuator mechanism. The actuator mechanism 22 should have a range of motion sufficient that the surface 13 of microelectronic workpiece 12 can be moved entirely through the impingement area. An actuator rod 24 may be connected between the actuator mechanism 22 and the movable chuck 14, and may also include a vacuum passage for providing the vacuum to the surface of the movable chuck 14 for securing the microelectronic workpiece 12, as discussed above.

To control the fluid dynamics within the aerosol chamber 16, a flow separator comprising a baffle plate 34 is connected to an end of the movable chuck 14 and to extend into the exhaust duct 20. Additionally, a shroud 36 is provided within the aerosol chamber 16 and comprises a plate connected to the aerosol chamber 16, such as its upper wall, for controlling flow around the nozzle 18. The controlling of the fluid dynamics within the aerosol chamber 16 by the baffle plate 34 and the shroud 36 are more fully described in U.S. Pat. No. 5,810,942. The basic purpose is to divide the post-impingement flow into positive streams C and D for preventing recontamination.

Nozzle 18 of the present invention is supported within the aerosol chamber 16. Optionally, in accordance with U.S. Pat. No. 5,942,037, nozzle 18 may be rotatably adjustable as indicated by arrow A and to be translatable along the direction of arrow B to adjust the spacing between nozzle 18 and the surface 13 of the workpiece 12. Nozzle 18 is connected with a supply line 26, which itself may be further connected with discreet supply lines 28 and 30 connected with the actual gas or liquid supplies of argon, nitrogen, or the like, depending on the specific process. Further processing steps, such as gas cooling, may take place within the supply line 26, again depending on the specific process, so that the nozzle 18 expels the desired aerosol, such as a cryogenic cleaning aerosol. The inside of the aerosol chamber 16 may be further connected with either a vacuum device or a pressurizing device for selectively controlling the desired pressure within the aerosol chamber 16 based upon the specific process. A vacuum device (not shown) may be connected through the exhaust duct 20. Pressure may be increased simply by providing gas through the nozzle 18 or by way of another supply line. For example, in a cryogenic cleaning apparatus using argon and nitrogen it is normally desirable to reduce the pressure within the aerosol chamber 16 for forming the cryogenic crystals. As described above in the background section, the cryogenic crystals are primarily formed by evaporative cooling which relies on the freezing of small liquid droplets prior to impinging the surface 13 of the workpiece 12. The small liquid droplets are formed from larger droplets that are atomized by the high pressure gas that expands from the nozzle orifices along with the large liquid drops. The small liquid droplets (the aerosol spray) freeze due to the temperature drop associated with the pressure drop between the nozzle and the aerosol chamber 16.

Also shown in FIG. 5, a make-up gas, preferably an inert gas such as nitrogen, can be introduced into the aerosol chamber 16 at one or more locations indicated by way of supply conduits 38. Although not necessary, such make-up gas is preferably introduced at the top and/or bottom of the aerosol chamber 16 the other side thereof away from the exhaust. The reason for the use of the make-up gas is to compensate or make-up for slight pressure deviations (in the order of 5 to 10 percent) within the aerosol chamber caused by instabilities in the nozzle and pressure controls. By supplying the make-up gas, the defect of any local pressure differentials is minimized and the positive overall pressure flow from the left to the right that is generated by the action of the impingement jets, as illustrated in FIG. 5, is maintained. The make-up gas can be introduced into the aerosol chamber 16 through slots provided through the top and bottom walls of the aerosol chamber 16. Conventional gas supply techniques can be used.

Figure 6:
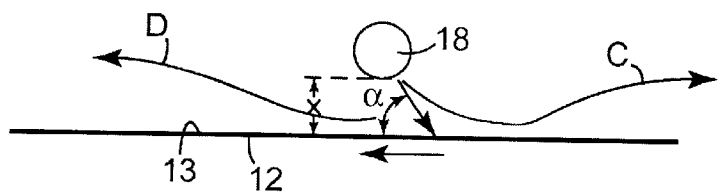
FIG. 6 is a schematic side view of a substrate moving to the left relative to a nozzle of the present invention and showing the angle of impingement of a jet stream and the spray distance between the nozzle and the substrate surface.
Figure 7:
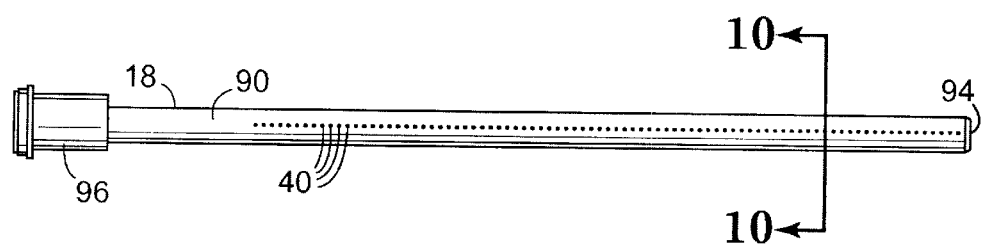
FIG. 7 is a side view of a nozzle of the present invention showing a linear array of nozzle orifices distributed along the length of the nozzle.
Figure 8:
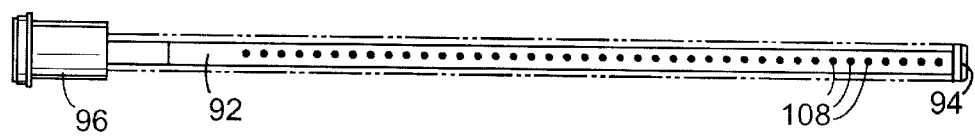
FIG. 8 is a side view of the nozzle of FIG. 7 that is rotated by 90 degrees radially from the view of FIG. 7, wherein the outer tube (shown by the chain lines) is removed and the inner tube is shown as having a linear array of orificies distributed along its length.
Figure 9:
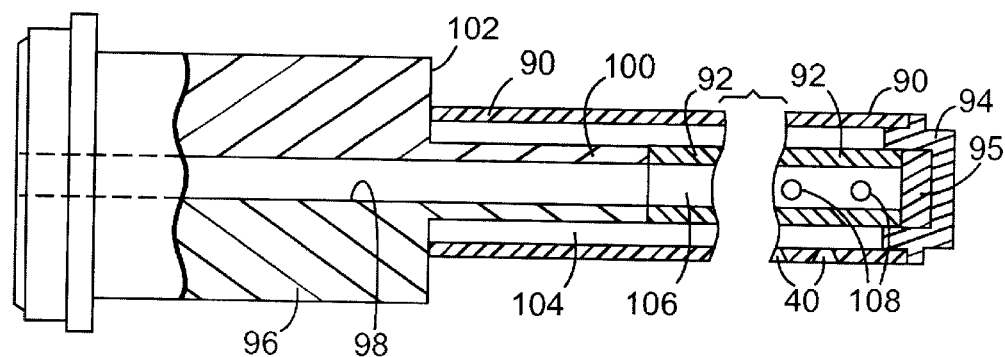
FIG. 9 is a partial cross-section view of the nozzle of FIG. 7.
Figure 10:
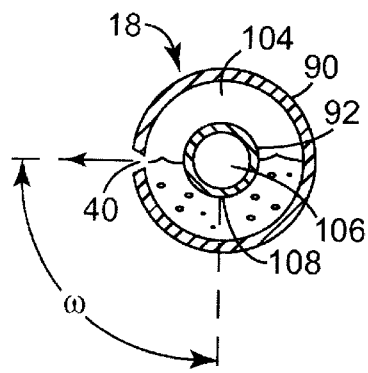
FIG. 10 is a partial cross-section view of the nozzle of FIG. 7 taken along plane 10—10.
Figure 11:
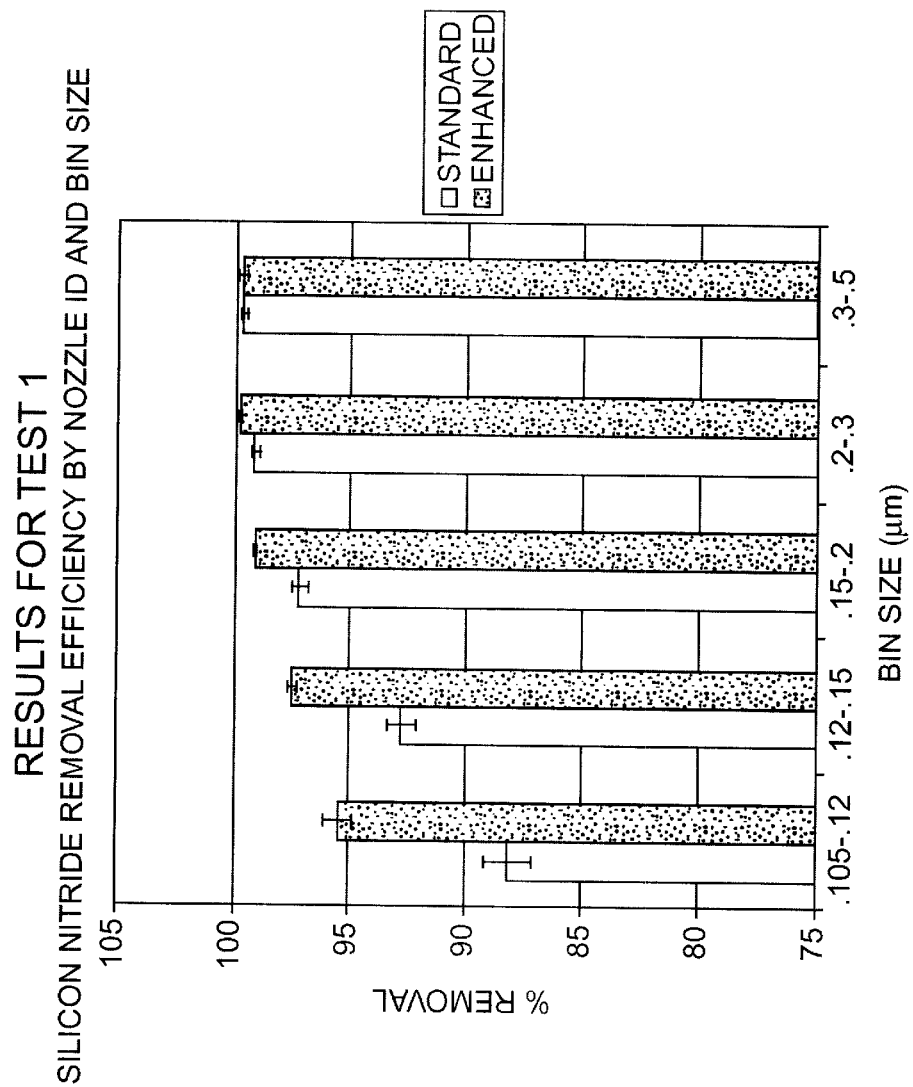
FIG. 11 is a graph of results showing particle removal efficiency of an inventive embodiment compared to a conventional spraypost.
Figure 12:
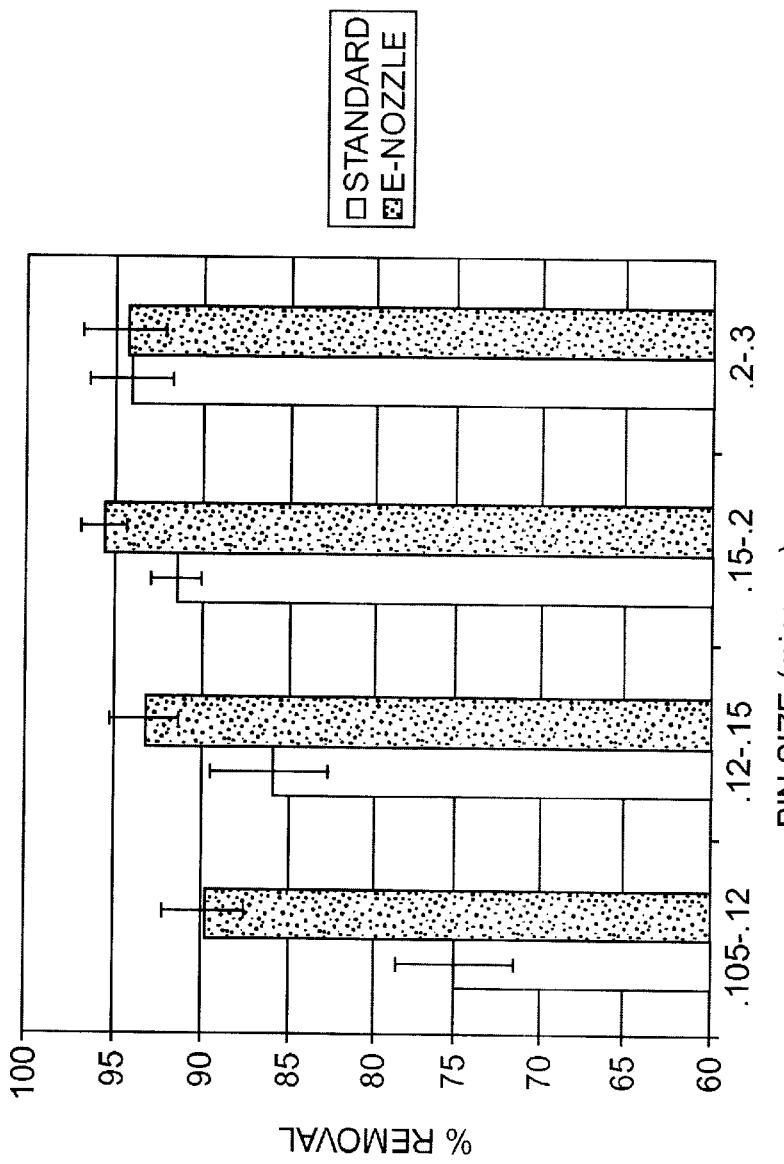
FIG. 12 is a graph of results showing particle removal efficiency of an inventive embodiment compared to a conventional spraypost.

With reference to FIG. 6, the orientation of jet impingement orifices 40 relative to workpiece 12 defines the angle of impingement α of the substance that is used to treat the surface 13 of the workpiece 12. In the case of a cryogenic cleaning apparatus, the substance preferably comprises the frozen cryogenic crystals and gas stream. Optionally, in accordance with U.S. Pat. No. 5,942,037, the nozzle 18 is rotatably mounted within the aerosol chamber 16 so that the angle α can be varied depending on the desired cleaning angle. Thus, the nozzle is useful or more efficient in a wider range of applications. Specifically, the processing of substrates including deep trenches and other surface features may be more thoroughly accomplished by orienting the aerosol spray direction nearly perpendicular to the substrate surface where α is 90°. For processing a very flat surface, the aerosol spray may be provided at a very shallow grazing angle that is close to an angle α of 0°. Other surfaces may require α angles anywhere between 0°. and 90°. FIG. 6 shows the workpiece 12 moving to the left. If, however, the wafer is moved to the right, the angle of impingement α could similarly be adjusted between α angles of 90°. through 180°. Depending on the surface features of the substrate, e.g. workpiece 12, the angle α may be altered from substrate to substrate or during the cleaning of a single substrate.

Preferably, the nozzle 18 of the present invention is also adjustable toward or away from the surface 13. The distance x (see FIG. 6) between the lower edge of the nozzle and the substrate surface can be adjusted to optimize any specific process. Moreover, with substrates of varying thicknesses, it is possible to manipulate the spray nozzle 18 to maintain a fixed spray travel distance x to the substrate surface over the variable thickness substrate surface.

Figure 13:
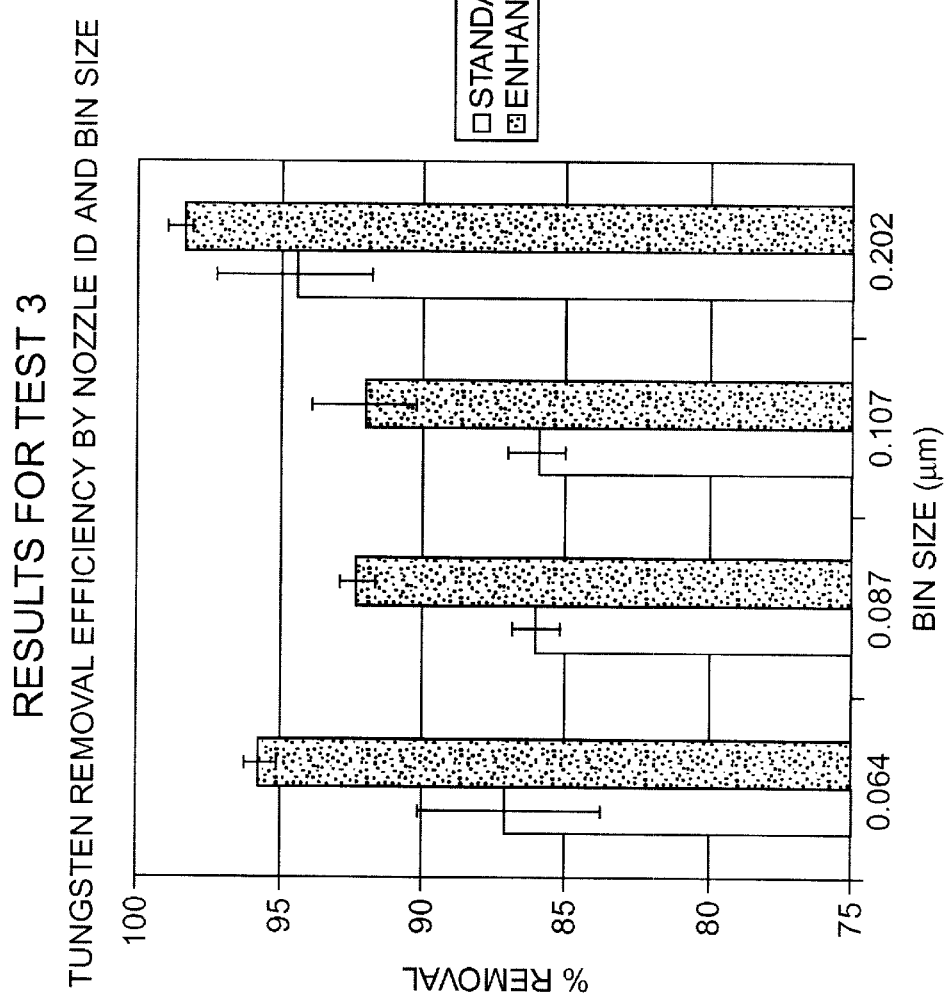
FIG. 13 is a graph of results showing particle removal efficiency of an inventive embodiment compared to a conventional spraypost.

Nozzle 18, in accordance with the present invention, is illustrated in more detail in FIGS. 7 through 10. Generally, the nozzle 18 comprises an outer tube 90, an inner tube 92, an end cap 94, an end cap 95 and a fitting 96 which preferably is a part of a VCR fitting as discussed in U.S. Pat. No. 5,942,037 for connection with a supply tube. As shown in FIG. 9, the fitting 96 includes an internal passage 98 that opens from the left side of the fitting 96, as illustrated, to communicate with the supply tube (not shown). At the other end of the fitting 96, a tube portion 100 is provided through which the passage 98 also passes. Surrounding the tube portion 100, the outer tube 90 is connected to the surface 102 of the fitting 96. Preferably, the outer tube 90 and the tube portion 100 are concentrically arranged. The outer tube 90 can be conventionally connected with surface 102 by welding. The inner tube 92 is preferably butted with and connected to the tube portion 100, such as by welding. At the other end of the nozzle 18, the end cap 95 is sealingly connected to the end of the inner tube 92 and is nested within the end cap 94 that seals the end of the outer tube 90 and supports both the inner and outer tubes 92 and 90, respectively. Preferably, end cap 94 maintains the concentric relationship of the outer tube 90 and inner tube 92.

By this construction, a first cavity 104 is defined within the outer tube 90 by its internal surface, the outer surface of the inner tube 92, the surface 102 of the fitting 96 and the end cap 94. A second internal cavity 106 is also defined within the outer tube 90, specifically within the inner tube 92 and the tube portion 100 of fitting 96 as defined by the interior surfaces thereof and the end cap 95.

The inner tube is preferably provided with a series of longitudinally aligned orifices 108. The orifices 108 need not be arranged in this manner, however, and in some cases may be purposefully misaligned. For example, some orifices 108 may be radially displaced by 180 degrees from others. The orifices 108 provide communication between the second internal cavity 106 and the first internal cavity 104. The jet impingement orifices 40 are provided in a longitudinally aligned series through the outer tube 90 to provide communication from the first internal cavity 104 and the outside of the nozzle. More specifically, the jet impingement orifices 40 direct the fluid/gas mixture therein toward the workpiece 12, in the direction and angle of impingement a discussed above and shown in FIG. 6.

As shown in FIGS. 7–10, nozzle 18 includes a series of longitudinally aligned jet impingement orifices 40. In accordance with the present invention, inner orifices 108 are not radially aligned with the jet impingement orifices 40. That is, they are radially angularly offset with respect to one another. Preferably, the inner orifices 108 are angularly offset from the jet impingement orifices 40 by an angle ω in the range of 45 to 180 degrees, most preferably about 90 degrees. As shown best in FIG. 10, nozzle orifices 40 have a conical, divergent structure in accordance with the present invention.

In the case of a cryogenic aerosol cleaning apparatus, the jet impingement orifices 40 and the inner orifices 108 are aligned to extend longitudinally along the outer tube 90 and inner tube 92 respectively. The sizing of the jet impingement orifices 40 is determined on the basis of the formation of the liquid droplets that are atomized and frozen due to the pressure differential between the first internal cavity 104 and the inside of the aerosol chamber 16, which is provided at vacuum. However, it is preferable to maintain the pressures within the first internal cavity 104 and the second internal cavity 106 at substantially the same. To accomplish this, the cross-sectional area of the second internal cavity 106 should substantially equal to the cumulative areas of the inner orifices 108. That is, by totaling the area of all of the inner orifices 108, that area should substantially equal the cross-sectional area of the second internal cavity 106. Preferably, the inner orifices 108 are substantially larger than the jet impingement orifices 40, and thus, substantially less inner orifices 108 are provided along the longitudinal length of the inner tube 92 as compared to the number of jet impingement orifices 40 along the outer tube 90.

The present invention will now be described with reference to the following illustrative example.

EXAMPLE

Tests were conducted to demonstrate the boost in cryogenic cleaning performance provided by the present invention. To carry out these tests a cryogenic cleaning tool commercially available under the registered trademark ARIES from FSI International, Inc., Chaska, Minn., was used. The standard ARIES tool is fitted with a standard, 8-inch long nozzle arm containing a linear array of 129, straight-drilled, cylindrical orifices distributed across the length of the nozzle arm. Each of these orifices had a substantially uniform diameter of 0.005 inches. The length of each orifice was 0.010 inches.

The standard ARIES tool was enhanced by replacing the standard nozzle arm with an enhanced nozzle arm of the present invention. The enhanced nozzle arm includes an 8 inch long nozzle arm containing a linear array of 100, conically-drilled orifices distributed along the length of the nozzle arm. The inner diameter of each orifice was 0.005 inches. The outer diameter of each orifice was 0.019 inches. The wall thickness of the nozzle arm was 0.035 inches. This provided an angle of 11.5° between the wall and the longitudinal axis of each nozzle orifice.

The particle removal performances of the standard and enhanced ARIES tools were compared in three tests. For each test, the cryogenic fluid was a 210:70 standard liter per minute (slm) mixture of $Ar:N_2$. The pressure inside the nozzle was 70 to 75 psig. The chamber pressure outside the nozzle was 50 torr. A curtain gas of 195 slm nitrogen flowed through the chamber. Each tool thus has the same net mass flow conductance through the respective nozzle. Also, note that the conventional nozzle (having 129 orifices) included about 29% more orifices than the enhanced nozzle design (having 100 orifices). This provided the conventional nozzle with a substantial efficiency advantage inasmuch as the use of more orifices tends to provide better cleaning efficiency.

In a first test, about 36,000 SiN particles were dunk deposited onto test wafers. The test wafers were then cleaned using conventional and enhanced ARIES tools, respectively. The results are shown in FIG. 11. A SURF SCAN SP1$^{TBI}$ apparatus commercially available from KLA-Tencor Corp., Milipitas, Calif., was used for counting particles on the wafer surface prior to and after cleaning in "normal" mode scanning.

In a second test, about 5300 SiN particles were dunk deposited onto test wafers. The test wafers were then cleaned using conventional and enhanced ARIES tools, respectively. The results are shown in FIG. 12. The Surfscan SP1$^{TBI}$ apparatus was used for counting particles in "normal" mode scanning prior to and after cleaning.

In a third test, W particles of respective sizes 0.064, 0.087, 0.107, and 0.202 micrometers were deposited onto respective spots on test wafers. There were about 5000 uniformly sized particles per spot. Particles were deposited using the "dry" method using an MSP-2300 deposition system. The test wafers were then cleaned using conventional and enhanced ARIES tools, respectively. The Surfscan SP1$^{TBI}$ apparatus was used for counting particles in "oblique" mode scanning in order to count the very small particles. The results are shown in FIG. 13.

In all tests, the enhanced ARIES tool did a much better job at removing smaller particles than did the conventional ARIES tool. As a consequence, the enhanced nozzle of the present invention incorporating conical drilled orifices is a much better nozzle than a conventional nozzle that incorporates only straight-drilled orifices through which cyrogenic jets are formed.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. An apparatus for cryogenically treating a surface of a workpiece, said apparatus comprising:
   (a) a treatment chamber in which the workpiece is positioned for a cryogenic treatment, wherein the treatment chamber is at a first, relatively low pressure;
   (b) a nozzle comprising a plurality of nozzle orifices distributed along a length of the nozzle in a manner effective to aim at an angle of impingement toward the workpiece surface, wherein each nozzle orifice comprises a nozzle inlet having a diameter through which a process fluid enters the nozzle orifice and an outlet through which the process fluid is cryogenically discharged from the nozzle orifice toward the workpiece surface, wherein the nozzle is at a second, relatively high pressure such that the difference between the first and second pressures causes the formation of liquid droplets that are atomized and frozen as the process fluid passes through the nozzle orifices, wherein each of at least two of the nozzle orifices (i) comprises a divergent section and (ii) has a longitudinal distance between the inlet and the outlet that is from about 1 to about 20 times the diameter of the nozzle inlet.

2. The apparatus of claim 1, further comprising a source of a cryogenic process fluid operatively coupled to the nozzle.

3. The apparatus of claim 2, wherein the divergent sections of said at least two nozzle orifices diverge linearly from the nozzle inlet to the nozzle outlet.

4. The apparatus of claim 3, wherein the linearly diverging nozzle orifices have an angle of divergence in the range from 5 to 70.

5. The apparatus of claim 1, wherein the nozzles are distributed in a linear array across a length of the nozzle.

6. A method of cryogenically treating a surface of a workpiece, comprising the steps of:
   a) providing an apparatus for cryogenically treating a surface of a workpiece, said apparatus comprising:
      (i) a treatment chamber in which the workpiece is positioned for a cryogenic treatment, wherein the treatment chamber is at a first, relatively low pressure;
      (ii) a nozzle comprising a plurality of nozzle orifices distributed along a length of the nozzle in a manner effective to aim at an angle of impingement toward the workpiece surface, wherein each nozzle orifice comprises a nozzle inlet having a diameter though which a process fluid enters the nozzle orifice and an outlet through which the process fluid is cryogenically discharged from the nozzle orifice toward the workpiece surface, wherein the nozzle is at a second, relatively high pressure such that the difference between the first and second pressures causes the formation of liquid droplets that are atomized and frozen as the process fluid passes through the nozzle orifices, wherein each of at least two of to nozzle orifices (a) comprises a divergent section, and (b) has a longitudinal distance between the inlet and the outlet that is from about 1 to about 20 times the diameter of the nozzle inlet; and
   b) causing a process fluid to be cryogenically discharged from the nozzle orifices onto the workpiece surface.

7. The method of claim 6, further comprising a source of a cryogenic process fluid operatively coupled to the nozzle.

8. The method of claim 7, wherein the divergent sections of said at lease two nozzle orifices diverge linearly from the nozzle inlet to the nozzle outlet.

9. The method of claim 8, wherein the linearly diverging nozzle orifices have an angle of divergence in the range from 5 to 70.

10. The method of claim 6, wherein the nozzles are distributed in a linear array across a length of the nozzle.

11. The method of claim 6, wherein said divergent sections are proximal to the corresponding orifice outlet.

12. The method of claim 6, wherein said divergent sections are proximal to the corresponding orifice inlet.

13. The method of claim 6, wherein said divergent sections extend from the corresponding orifice inlet to the corresponding orifice outlet.

14. The apparatus of claim 3, wherein the linealy diverging nozzle orifices have an angle of divergence in the range from 11 to about 35.

15. The apparatus of claim 3, wherein the linearly diverging nozzle orifices have an angle of divergence in the range from 11 to 18.

16. The method of claim 8, wherein the linearly diverging nozzle orifices have an angle of divergence in the range from 11 to about 35.

17. The method of claim 8, wherein the linearly diverging nozzle orifices have an angle of divergence in the range from 11 to 18.

* * * * *

UNITED STATES PATENT AND TRADEMARK OFFICE
CERTIFICATE OF CORRECTION

PATENT NO. : 6,578,369 B2
DATED : June 17, 2003
INVENTOR(S) : Kunkel et al.

It is certified that error appears in the above-identified patent and that said Letters Patent is hereby corrected as shown below:

Column 11,
Line 42, "droplets that arc" should be -- droplets that are --.
Line 45, "section and" should be -- section, and --.

Column 12,
Line 13, "a diameter though" should be -- a diameter through --.
Line 22, "two of to nozzle" should be -- two of the nozzle --.

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,578,369 B2
APPLICATION NO. : 09/820281
DATED : June 17, 2003
INVENTOR(S) : Kunkel et al.

Page 1 of 1

It is certified that error appears in the above-identified patent and that said Letters Patent is hereby corrected as shown below:

On the title page item (75) Inventors: please delete "Natraj Narayanswani" and insert --Natraj Narayanswami--

Signed and Sealed this

Eighteenth Day of August, 2009

David J. Kappos
*Director of the United States Patent and Trademark Office*